United States Patent [19]
Wang et al.

[11] Patent Number: 6,026,564
[45] Date of Patent: Feb. 22, 2000

[54] METHOD OF MAKING A HIGH DENSITY MULTILAYER WIRING BOARD

[75] Inventors: Peter Wang, Basking Ridge, N.J.; Yu-Wen Huang, Taipei, Taiwan

[73] Assignee: ANG Technologies Inc., Basking Ridge, N.J.

[21] Appl. No.: 09/058,681

[22] Filed: Apr. 10, 1998

[51] Int. Cl.[7] ..................................................... H05K 3/36
[52] U.S. Cl. .............................. 29/830; 29/831; 29/840; 29/852; 174/52.1
[58] Field of Search .............................. 29/830, 832, 840, 29/852, 831; 174/52.1, 155, 156, 158 R, 257, 258, 259; 257/774

[56] References Cited

U.S. PATENT DOCUMENTS

| | | | |
|---|---|---|---|
| 4,803,450 | 2/1989 | Burgess et al. | 333/238 |
| 5,031,308 | 7/1991 | Yamashita et al. | 29/830 |
| 5,048,166 | 9/1991 | Wakamatsu | 29/830 |
| 5,199,163 | 4/1993 | Ehrenberg et al. | 29/830 |
| 5,220,723 | 6/1993 | Okada | 29/830 |
| 5,285,570 | 2/1994 | Fulinara | 29/830 |
| 5,384,955 | 1/1995 | Booth et al. | 29/830 |
| 5,386,627 | 2/1995 | Booth et al. | 29/852 |
| 5,403,671 | 4/1995 | Holzmann | 428/601 |
| 5,509,200 | 4/1996 | Frankeny et al. | 29/852 |

OTHER PUBLICATIONS

"High Density Multilayers and Materials News from Japan," Prismark Partners LLC, 1996, (2 pages).
Hwang, T.S., "Chip Size Package," Jun. 9, 1997, (3 pages).
"Flip–Chip Mounting Goes Mobile," Special Report, Nikkei Electronics Asia, Aug. 1996 (8 pages), pp. 50–55.
McDermott, B., "The Practical Application of Micro–Via Technology," National Conference on HDIS, Santa Clara, Nov., 1997 (10 pages).
"Flip Chip Underfill," Johnson Matthey; Electronics, 1996 (1 page).
"CSP Packages," Integrated Electronics Engineering Center and Prismark Partners LLC, 1997 (2 pages).
"Compaq, Motorola Lead US Drive for BGA Packages," Special Report, Nikkei Electronics Asia, May 1994, pp. 40–47.
"CSP Packages Get Skintight," Technology Trend, Nikkei Electronics Asia, Apr. 1995, pp. 52–55.
"Sony Puts 20 CSPs in Digital Camcorder," News Focus, Nikkei Electronics Asia, Nov. 1996, p. 40.
Prasad, R., "Reflow Solder Profile Development," Technical Articles on Profiling, ECD (3 pages).
Solder Reflow Technology, (1 page).
"Build–up PCBs Boost Density," Special Report, Nikkei Electronics Asia, Jun. 1995, pp. 34–39.
"13 US Firms Disclose 100VG–AnyLAN Plan," News Focus Nikkei Electronics Asia, May 1995, p. 48.

(List continued on next page.)

*Primary Examiner*—Lee Young
*Assistant Examiner*—Binh-An Nguyen
*Attorney, Agent, or Firm*—Cohen, Pontani, Lieberman & Pavane

[57] ABSTRACT

A process of making a multilayer printed wiring board assembly. The process includes the steps of providing a first and a second substrate made of a dielectric material; depositing a first wiring pattern on the first substrate and a second wiring pattern on the second substrate with a conductive material; depositing a dielectric material on the first and second wiring patterns and defining a via connecting zone on the first and the second wiring pattern for communicating signals between the first and the second wiring pattern by exposing a selective portion of the first and second wiring patterns; depositing a conductive bonding material on the via connecting zone of one of the first and the second wiring pattern; arranging the first and the second substrate in sandwiched juxtaposition such that the via connecting zones of the first and the second wiring pattern are opposite each other and in substantial alignment with each other so that the conductive bonding material deposited on the one of the via connecting zones contacts another one of the via connecting zones; and curing the deposited bonding material thereby forming a conductive joint connecting the first and the second via connecting zones.

6 Claims, 2 Drawing Sheets

OTHER PUBLICATIONS

"Matsushita Designs PCB for 93cm$^3$, 93g Mobile Phone," News Focus, Nikkei Electronics Asia, Mar. 1997, p. 34.

"Sumitomo, Enplas Market Replaceable MCM Substrate," News Focus, Nikkei Electronics Asia, May 1995, p. 46.

"Toshiba Buried–Bump Wiring Clips Portable Board Footprint," Nikkei Electronics Asia, Jun. 1997, pp. 80–83.

"Inside the Newest Sony Camcorder," Portable Design, May 1997, pp. 28–32.

"Sony DCR–PC7 Camcorder," (1 Page).

"Sony Digital Handycam," Sony Digital Handycam—Mightly Midget (1 Page).

"CSPs on the Sony Camcorder Main Board" (1 page).

"Integrated Electronics Engineering Center," Prismark Partners LLC, 1997, pp. 1–2.

"Flip Chip Time," Prismark Partners LLC, (4 pages).

"Wall to Wall Silicon, CSP and BUM," Prismark Partners LLC, 1996, pp. 1–3.

"Built Up Multilayers building Nicely," Prismark Partners LLC, (3 pages).

"Chip Size Packages—Time To Place Your Bets," Prismark Partners LLC, 1996, (3 pages).

"Chip Size Packaging—Early Experience," Prismark Partners LLC, 1996, (2 pages).

METHOD OF MAKING A HIGH DENSITY MULTILAYER WIRING BOARD

BACKGROUND OF THE INVENTION

1. Field of the Invention

The present invention relates to methods of making printed wiring boards and more particularly, to a method of making high density multilayer wiring boards by affixing a plurality of double-sided boards through inter-layer conductive paths or vias.

2. Description of the Related Art

The demand for greater miniaturization of electronic products such as notebook computers, cellular phones, camcorders and the like has presented new challenges for printed circuit board (PCB) makers as more and more high density integrated circuit (IC) chip packages such as ball grid arrays (BGAs) and chip-size packages (CSPs) become more readily available. These chip packages, which contain high-density integrated circuits therewithin, typically have an extremely high number of input/output (I/O) connections. To provide greater surface area for the I/O connections while minimizing the footprint of the packages, these chip packages typically have 2-dimensional arrays of solder bumps disposed on the bottom surface of the packages for I/O connections. Connecting these chip packages to the rest of the circuitry is no easy feat as the number of I/O connections may range anywhere from 170 to 1000 and the pitch, i.e. the center-to-center distance between these I/O connections, may be as small as 0.5 mm.

Consequently, the circuit board must "fan out" the input/output signals of the chips using multiple board layers. Routing such a high number of I/O signals from these chip packages almost always requires that the signal paths be distributed to the lower layers of the boards through "vias," i.e. conductive paths which travel through the thickness of a multilayer wiring board. These vias may extend from a surface layer to an adjacent inner layer (i.e. surface vias), between two adjacent inner layers (i.e. buried vias), or between a top and a bottom surface layer (i.e. through hole vias). However, in a conventional printed wiring board, these vias use up valuable space on the board.

Prior art printed wiring boards made of glass based epoxy resin typically employ through-hole vias to interconnect the inner and outer layers of the boards. The through-hole vias are made by drilling holes through the entire thickness of the multilayer board and then plated with a conductive material. Thus, even if only two inner conductive layers of a six-layer board are to be connected, this board would nevertheless have plated through-holes extending through the six layers of the board. These through-holes are typically about 300 $\mu$m in diameter.

Another prior art multilayer wiring board called the "via board" requires the via holes be drilled, one at a time, then plated with a conductive material, and then filled with an insulator. The minimum hole diameter for the vias is also about 300 $\mu$m.

Still another prior art multi-layer board is the so-called "build-up board." The build-up board, as the name implies, is constructed through a sequential build up of alternating insulating and conductive layers over a laminated plate, or core board. The insulating layer is made of a photosensitive resin so that holes can be opened up during the photolithography process to form vias. However, to connect the top and bottom surface layers of the build-up board, a through hole must still be drilled through the core board. The diameter of the vias of build-up boards is about 100–150 $\mu$m, which is about half the size of the through-holes in a conventional printed wiring board. The cost associated with build-up boards is quite high and has not yet gained wide acceptance by PCB makers.

SUMMARY OF THE INVENTION

It is therefore an object of the present invention to provide a simple, low cost manufacturing process of making a high density multilayer wiring board with a large number of buried or blind vias for routing signal paths from high density I/O intensive chip packages.

Another object of the present invention is to join a plurality of double sided boards by first forming vias between adjacent double sided boards.

As was noted above, a difficulty in providing compact multilayer printed wiring boards for I/O intensive, chip-size packages is that the input/output connections of these packages are typically arrayed in the form of a two-dimensional matrix and have extremely fine pitches. Routing signal paths from these I/O connections, especially those of the inner arrays, cannot be done without substantially increasing the number of board layers and the number of vias therewithin. These high-density interconnection requirements simply cannot be met by conventional PWBs as the vias are typically made by drilling relatively large through-holes in the boards. These through-holes are undesirable as they waste valuable board space and increase production time and cost.

Advantageously, a presently preferred embodiment of the present invention provides a process of making a multilayer printed wiring board assembly, which includes the steps of providing a first and a second substrate made of a dielectric material; depositing a first wiring pattern on the first substrate and a second wiring pattern on the second substrate with a conductive material; depositing a dielectric material on said first and second wiring patterns and defining a via connecting zone on the first and the second wiring pattern for communicating signals between the first and the second wiring pattern by exposing a selective portion of the first and second wiring patterns; depositing a conductive bonding material on the via connecting zone of one of the first and the second wiring pattern; arranging the first and the second substrate in sandwiched juxtaposition such that the via connecting zones of the first and the second wiring pattern are opposite each other and in substantial alignment with each other so that the conductive bonding material deposited on the one of the via connecting zones contacts another one of the via connecting zones; and curing the deposited bonding material thereby forming a conductive joint connecting the first and the second via connecting zones.

The present inventive process advantageously affords the circuit board designers complete flexibility and freedom in the use of vias to interconnect and join the various layers of circuits without incurring significant production cost. Moreover, the inventive process advantageously requires much less production time as compared with, for example, prior art build-up boards, since the multilayer board of this process may be constructed in a single step rather than through a sequence of steps.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference characters denote similar elements throughout the several views.

DETAILED DESCRIPTION OF THE PRESENTLY PREFERRED EMBODIMENTS

Figure 1:
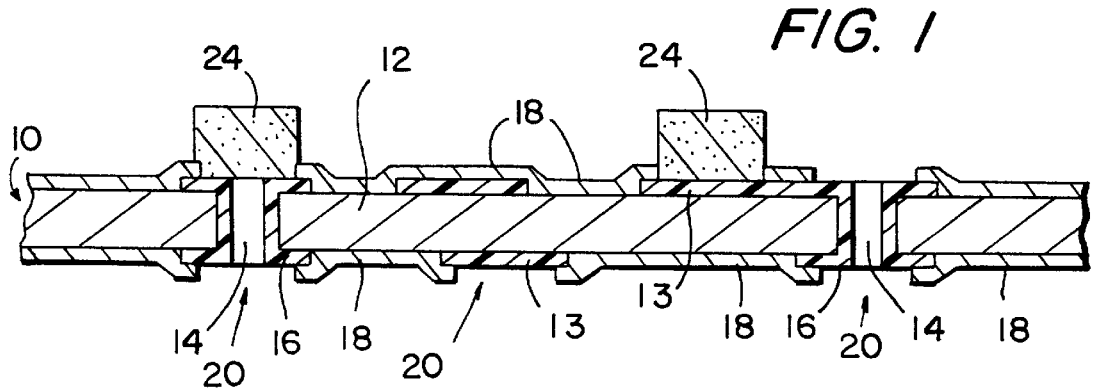
FIG. 1 is a sectional view of a double-sided printed wiring board in accordance with an embodiment of the present invention.

Referring now to the drawings in detail, and especially to FIG. 1, in accordance with a preferred embodiment of the present inventive process, there is initially provided a double-sided board 10 including a substrate 12 made of a dielectric material such as, for example, an epoxy-resin (e.g. FR-4). The substrate 12 may also be made of polyimide or Bismaleimide Triazene ("BT") resin although other materials having similar dielectric properties may be employed. Deposited on the top and/or bottom surface of the substrate 12 is a patterned conductive layer 13 such as, for example, a signal, power or ground plane. The conductive layer 13 may be deposited by, for example, printing or etching and made from any conductive material such as, for example, copper or aluminum.

The substrate 12 may have a plurality of via holes 14 defined through the thickness of the substrate 12. The via holes 14 may be formed by mechanical drilling. Advantageously, smaller via hole diameters than those of the through-holes of conventional printed wiring boards are possible in substrate 12. For example, if mechanical drilling were employed, smaller drill bits can be used for drilling the via holes 14 in substrate 12 since the drill bit need only go through one substrate layer in accordance with the present inventive process. Based on the foregoing disclosure it will be appreciated by the person of ordinary skill in the art that the thinner the substrates, the less rigid the drill bits need to be for producing a via hole with the requisite straightness and perpendicularity. In contrast, larger drill bits are required to bore through a conventional printed wiring board as the drill bit must drill through several layers of substrates which, as one would expect, present much greater resistant forces than those by a single substrate layer.

It is also within the intended scope of the present invention that the via holes 14 can also be made using a photo-lithography process. In such a case the substrate 12 is made of a photosensitive resin. Alternatively, a laser such as, for example, a $CO_2$ laser or a UV/YAG laser can be used to produce the via holes 14. Using these processes, via hole diameters as small as 5 mil or less can be obtained.

In the case where the via holes 14 are produced by the photolithography or laser drilling process, the walls defining these holes are preferably chemically roughened as by, for example, etching, because the holes produced by these processes tend to have relatively smooth walls as compared to those produced by mechanical drilling. The roughened walls provide more surface areas for bonding with a plating material thereby enhancing the strength of the bond therebetween and the long-term reliability of the electrical connection through the plated material.

The via holes 14 are then plated with a conductive material 16 such as, for example, copper for interconnecting with conductive layers on another board layer.

Next, the substrate 12 is coated or deposited with a dielectric material 18 such as, for example, a solder mask or photo-resist for insulating and protecting the conductive layer 13 therebeneath. As depicted in FIG. 1, the dielectric coat is preferably patterned to define via-connecting zones such as, for example, conductive via pads 20 by selectively exposing portions of the conductive layer 13 on the board 10 or the conductive trace around the plated via holes 14. The conductive via pads 20 are preferably metalized and wettable by solder, and dimensioned and configured to receive an optimal amount of conductive bonding material (e.g. solder) for attachment with corresponding via pads 20 of an another board layer.

Figure 2:
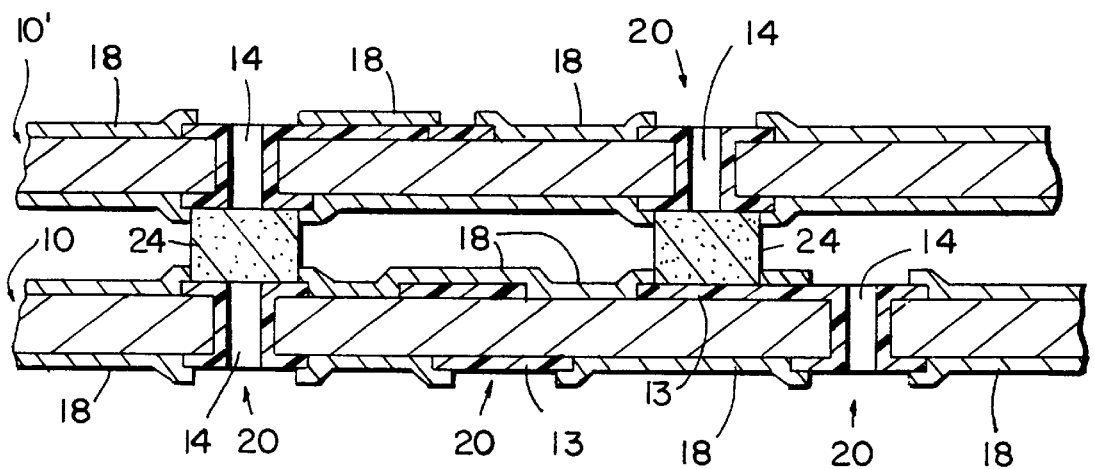
FIG. 2 is a sectional view of two double-sided printed wiring boards arranged in a vertically stacked relationship in accordance with another embodiment of the present invention.

A printed wiring board with multiple conductive layers may now be built by arranging the board 10 in sandwiched juxtaposition with an adjacent board 10' which is also constructed with the inventive process steps described above and having a power, ground or signal plane for operative interconnection with the conductive layers of the board 10 as shown in FIG. 2. The boards 10 and 10' are positioned so that corresponding via pads 20 of the boards 10, 10' are in substantial alignment with each other. Although it is preferred that the board 10' be stacked on top of the board 10 in this step, it is also contemplated that the boards 10 and 10' may also be positioned side-by-side during this step. The side-by-side arrangement advantageously relieves the to-be-cured bonding material 24 from being forcibly displaced from its via pads 20 due to the excess weight of the board 10'.

Figure 3:
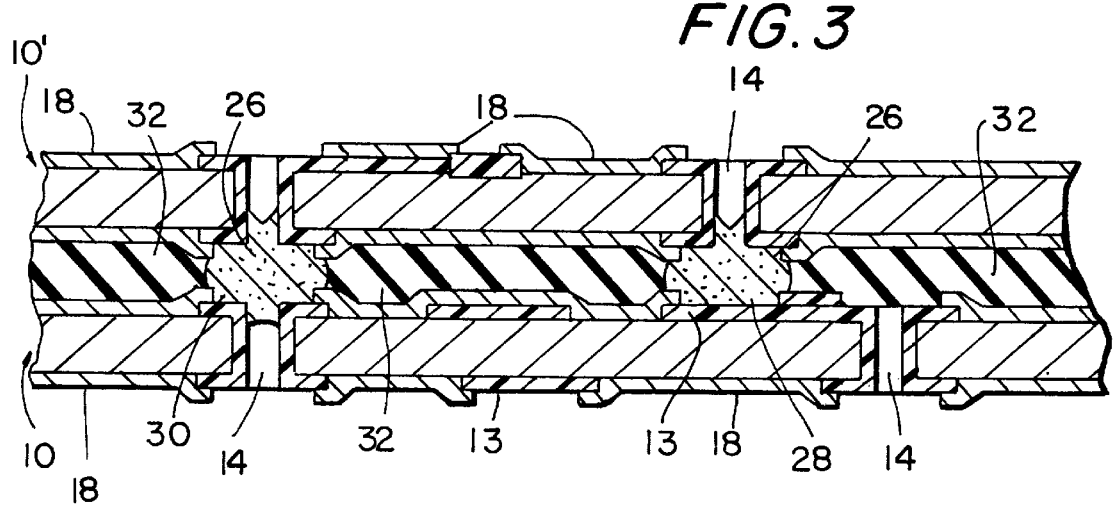
FIG. 3 is a sectional view of a multilayer printed wiring board with solder joints formed therebetween constructed in accordance with the present inventive process.

The boards 10 and 10' may now be joined or affixed to each other by the bonding material 24 by subjecting the boards 10, 10' to a preselected temperature profile over a preselected period of time so as to transform the bonding material 24 into crystalline or crystalline-like joint structures 26. As shown in FIG. 3, buried or blind vias 28 and through-hole vias 30 are thus formed by the joint 26 in the now assembled multilayer printed wiring board. The spacing between adjacent boards 10 and 10' or the length of the joint 26 is determined in part by the surface tension of the bonding material and the counteracting forces induced by, for example, the weight of the board 10' in, for example, a vertical stack arrangement.

In a preferred embodiment, solder paste consisting of, for example, a eutectic solder (i.e. 60-40 Sn/Sb) is used as the bonding material, the boards 10 and 10' advantageously become self-aligned when the solder paste is heated to a temperature at which the solder reflows due to the surface tension of liquid solder. This self-alignment feature of the inventive process advantageously lowers the cost of production because expensive and elaborate fixturing scheme is avoided.

To alleviate the solder joints or otherwise formed joints from stresses induced by, for example, warpage of the boards 10 and 10' resulting from non-uniform thermal expansion and contraction of the board components through temperature cycling, an underfill or encapsulation material 32, preferably a thermal setting resin, may be introduced into and substantially fills the interstitial space between boards 10 and 10' (through, for example, a syringe or silk screen process) as depicted in FIG. 3. The encapsulation material 32 once cured, relieves any stresses induced on these via joints 26 and thus increases the reliability of the assembled board. The encapsulation material 32, which is preferably a dielectric material, also decreases the stray capacitance of the board thereby enhancing the electrical performance of the assembled board. Preferably, the encapsulation material 32 has a coefficient of thermal expansion similar to that of the substrate 12 so as to minimize any stresses arising from the differential thermal expansion and contraction between the encapsulation material 32 and the substrate 12.

Figure 4:
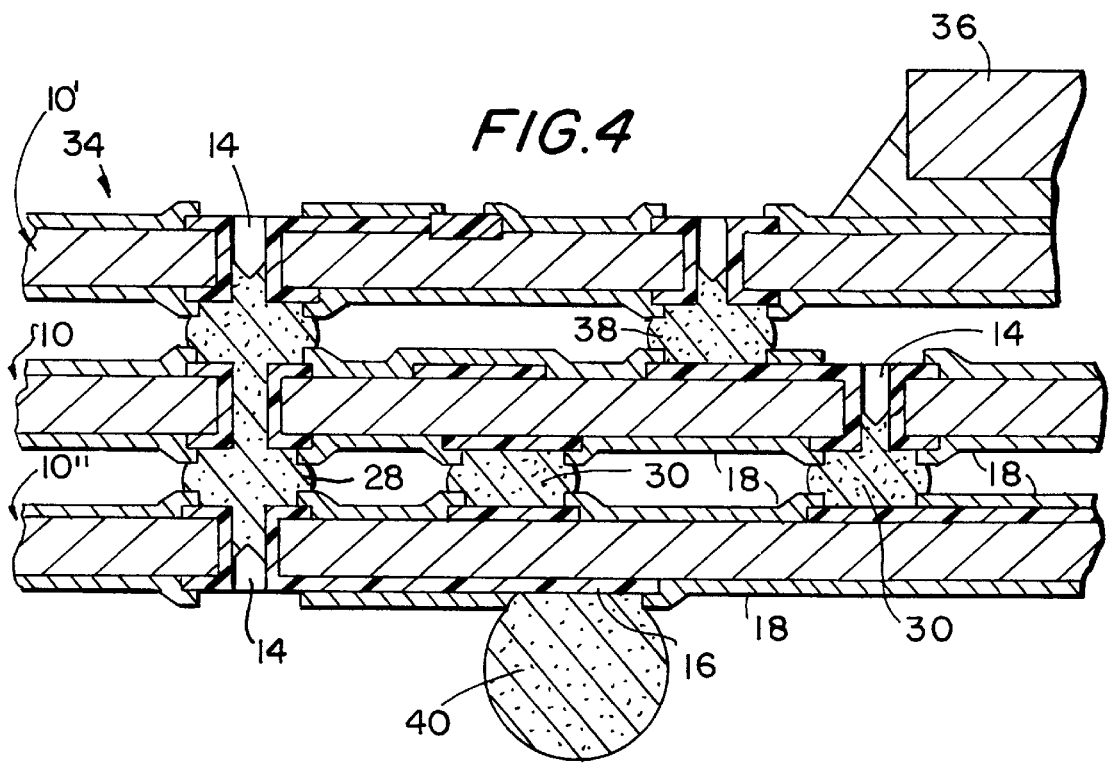
FIG. 4 is a sectional view of a multilayer printed wiring board with a high density area array chip package mounted thereon constructed in accordance with the present inventive process.

Although the inventive process has been described in terms of two substrate layers, an ordinary artisan will readily recognize that the present inventive process can also be used to build a multilayer printed wiring board having more than two substrate layers. Thus, for illustrative purposes, there is shown in FIG. 4 a multilayer printed wiring board assembly, in particular a multilayer substrate 34 having three substrate layers, constructed in accordance with the present inventive process. As depicted, the multilayer substrate 34 includes three double-sided boards 10, 10', 10", a small area array chip package 36 mounted on top of the multilayer substrate 34, and blind or buried vias 30, surface via 38 and a through hole via 28 disposed therewithin. The multilayer substrate 34 further includes at least one solder bump 40 disposed on its bottom surface for connection with another multilayer printed wiring board or another interconnection device.

Thus, while there have shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. It is the intention, therefore, to be limited only as indicated by the scope of the claims appended hereto.

We claim:

1. A process of making a multilayer printed wiring board assembly, comprising the steps of:

(a) providing a first substrate and a second substrate;

(b) depositing a first conductive wiring pattern on said first substrate and a second conductive wiring pattern on said second substrate;

(c) then forming and patterning a solder mask on said first and said second wiring patterns to define at least one via connecting zone on each of said first and said second wiring patterns for communicating signals between said first and said second wiring patterns by exposing a selective region of each of said first and said second wiring patterns while covering remaining portions of each of said first and said second wiring patterns;

(d) then depositing a predetermined amount of solder paste on said at least one via connecting zone of one of said first and said second wiring patterns;

(e) then arranging said first and said second substrates in sandwiched juxtaposition such that said via connecting zones of said first and said second wiring patterns are opposite each other and in substantial alignment with each other so that said solder paste deposited on said at least one via connecting zone of one of the first and second wiring patterns contacts the via connecting zone of the other of the first and second wiring patterns; and (f) then reflowing said deposited solder paste to form a solder joint for electrically connecting said first and said second wiring patterns and for mechanically joining said first and said second substrates, thereby forming a gap between said first and said second substrates.

2. The process of claim 1, wherein said at least one via connecting zone has a via hole therethrough and further comprising the step of plating said via hole with a conductive material.

3. The process of claim 1, wherein said first and second substrates are made of a dielectric material.

4. The process of claim 1, wherein said solder paste includes a eutectic solder alloy.

5. The process of claim 1, wherein the step of reflowing includes heating the solder paste to a temperature at which the solder paste reflows and then allowing the reflow solder paste to cool so as to form a solder joint.

6. The process of claim 1, further comprising the step of underfilling the gap with a dielectric material for electrically insulating the solder joint after the step of reflowing the deposited solder paste.

\* \* \* \* \*